United States Patent
Tokumitsu et al.

(10) Patent No.: US 9,543,630 B2
(45) Date of Patent: Jan. 10, 2017

(54) ELECTRONIC DEVICE

(71) Applicants: Sumitomo Electric Industries, Ltd., Osaka-shi (JP); Sumitomo Electric Device Innovations, Inc., Yokohama-shi (JP)

(72) Inventors: Tsuneo Tokumitsu, Yokohama (JP); Koji Tsukashima, Yokohama (JP); Seiji Fujita, Yokohama (JP)

(73) Assignees: Sumitomo Electric Industries, Ltd., Osaka-shi (JP); Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/736,822

(22) Filed: Jun. 11, 2015

(65) Prior Publication Data

US 2015/0364805 A1 Dec. 17, 2015

(30) Foreign Application Priority Data

Jun. 13, 2014 (JP) ................................ 2014-122295
Mar. 10, 2015 (JP) ................................ 2015-046983

(51) Int. Cl.
*H01P 5/18* (2006.01)
*H01P 5/12* (2006.01)
*H03H 7/01* (2006.01)

(52) U.S. Cl.
CPC ............. *H01P 5/12* (2013.01); *H03H 7/0123* (2013.01)

(58) Field of Classification Search
CPC ...................................................... H01P 5/18

USPC .................................. 333/109–112, 116–118
See application file for complete search history.

(56) References Cited

U.S. PATENT DOCUMENTS

| | | | | |
|---|---|---|---|---|
| 4,706,049 A * | 11/1987 | Dydyk | .................... | H01P 5/185 333/110 |
| 5,304,961 A * | 4/1994 | Dydyk | .................... | H03H 7/48 333/112 |
| 5,811,961 A * | 9/1998 | Daughters | .......... | G01R 33/3621 323/213 |
| 6,097,266 A * | 8/2000 | Nardozza | .................. | H01P 5/12 333/101 |
| 6,150,898 A * | 11/2000 | Kushitani | ............... | H01P 5/185 333/110 |
| 6,794,953 B2 * | 9/2004 | Brandt | ...................... | H01P 5/16 330/53 |
| 7,084,717 B2 * | 8/2006 | Okazaki | .................. | H01P 5/227 333/101 |
| 7,525,396 B2 * | 4/2009 | He | .......................... | H03F 1/526 330/124 D |
| 7,538,635 B2 * | 5/2009 | Fukuda | .................... | H01P 5/227 333/111 |
| 8,022,787 B2 * | 9/2011 | Inoue | ....................... | H01P 1/213 333/110 |

(Continued)

FOREIGN PATENT DOCUMENTS

JP 05-206743 A 8/1993

*Primary Examiner* — Dean Takaoka
(74) *Attorney, Agent, or Firm* — Venable LLP; Michael A. Sartori; F. Brock Riggs

(57) ABSTRACT

An electronic device comprises a divider and a first filter. The divider comprises a first terminal for inputting a high-frequency signal, a second terminal coupled to the first terminal, and third and fourth terminals for distributing thereto the signal inputted from the first terminal. The first filter is coupled to the second terminal.

11 Claims, 19 Drawing Sheets

(56) References Cited

U.S. PATENT DOCUMENTS

| | | | | |
|---|---|---|---|---|
| 2002/0113666 A1* | 8/2002 | Yamazaki | ............... | H01P 5/18 333/109 |
| 2011/0140803 A1* | 6/2011 | Kim | ............... | H01P 1/20 333/110 |
| 2013/0147535 A1* | 6/2013 | Hur | ............... | H01P 5/18 327/231 |

* cited by examiner

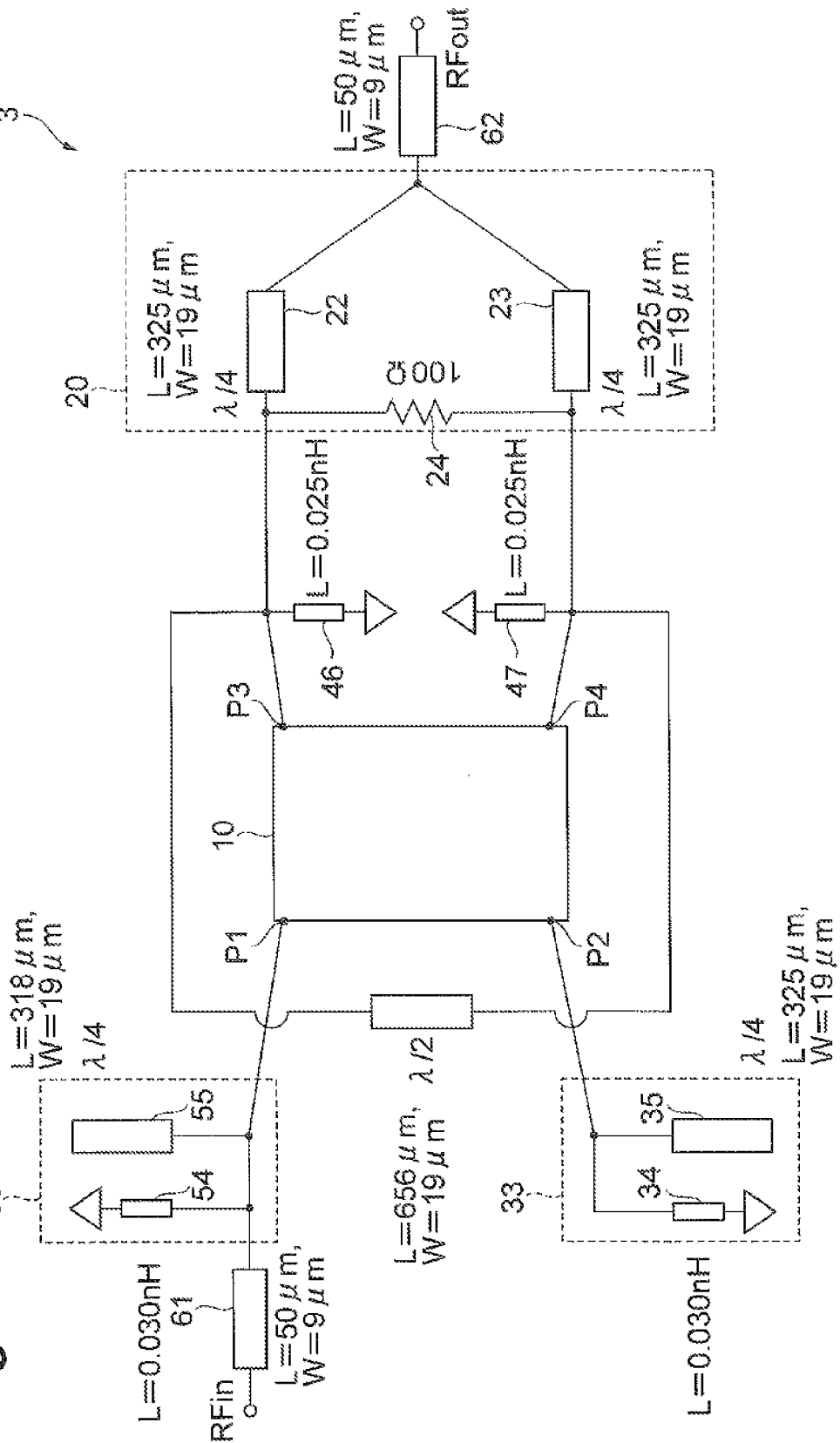

ELECTRONIC DEVICE

BACKGROUND OF THE INVENTION

Field of the Invention

The present invention relates to an electronic device which passes therethrough electric signals in a predetermined frequency band and blocks electric signals in other frequency bands.

Related Background Art

As a circuit for use in a high-frequency band, one equipped with a coupler has conventionally been known. For example, Patent Literature 1 discloses an amplifier with low third intermodulation equipped with a coupler. This amplifier with low third intermodulation causes two signal paths to produce third intermodulation with the same amplitude in antiphase with each other and combines two signals transmitted through the respective signal paths at the coupler in antiphase, so as to reduce the third intermodulations.

Patent literature 1: Japanese Patent Application Laid-Open No. H05-206743

Meanwhile, a filter made of a microstrip line comprising a plurality of conductor patterns arranged at predetermined intervals in a predetermined direction has been known as an electronic device for use in a high-frequency band. Such a microstrip line filter has a relatively large size. The microstrip line filter also requires a high precision for the conductor patterns.

It is therefore an object of the present invention to provide an electronic device which is small in size and requires less precision in conductor patterns.

SUMMARY OF THE INVENTION

The electronic device in accordance with one mode of the present invention comprises a first coupler and a first filter. The first coupler comprises a first terminal for inputting a high-frequency signal, a second terminal coupled to the first terminal, and third and fourth terminals for distributing thereto the signal inputted from the first terminal. The first filter is coupled to the second terminal.

BRIEF DESCRIPTION OF THE DRAWINGS

FIG. 13 is a diagram illustrating an example of a low-pass filter circuit;

DESCRIPTION OF THE PREFERRED EMBODIMENTS

Description of Embodiments of the Invention

Figure 1:
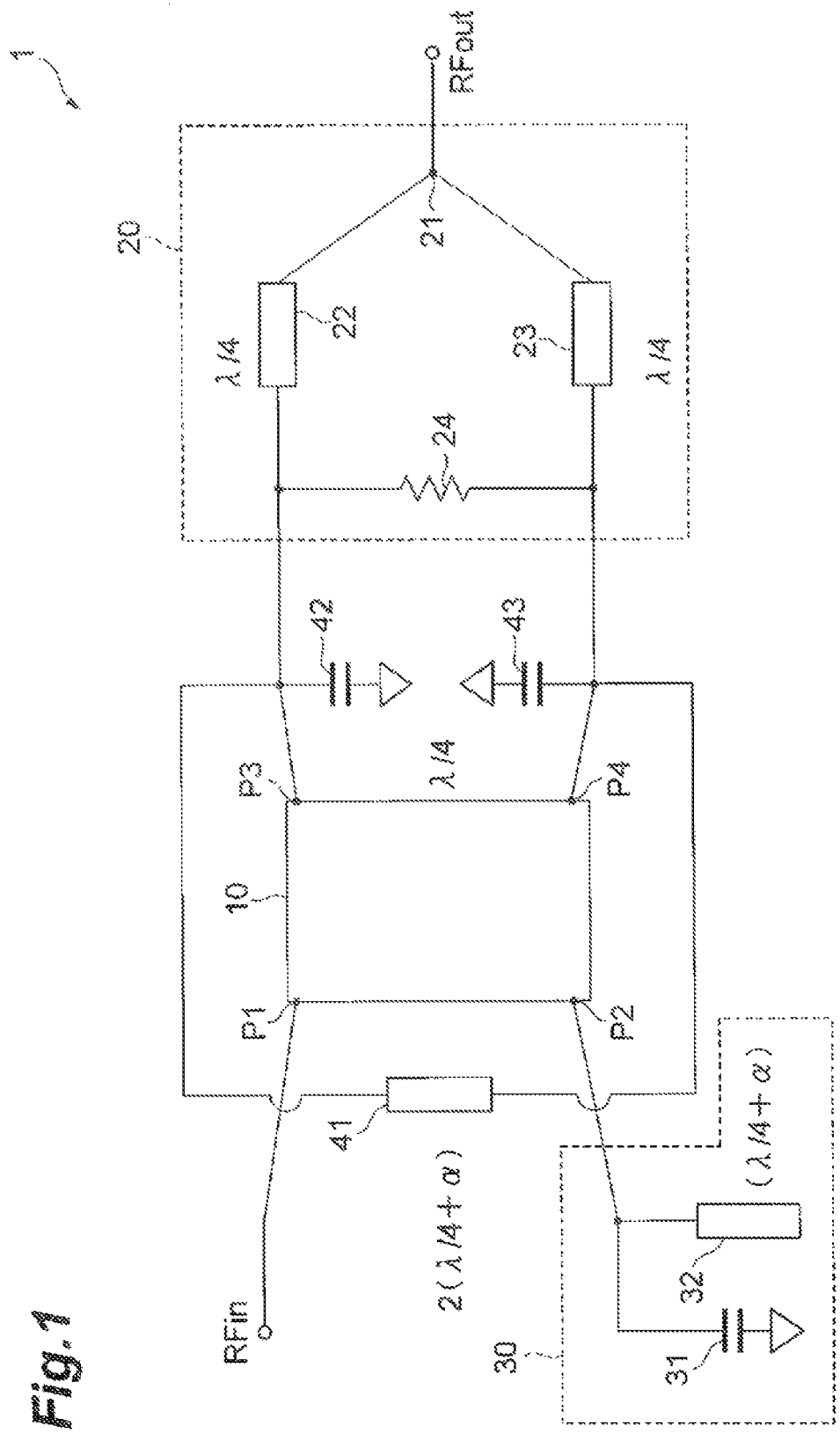
FIG. 1 is a diagram illustrating a schematic structure of the electronic device in accordance with an embodiment.

First, contents of embodiments of the present invention will be listed and explained.

The electronic device in accordance with one mode of the present invention comprises a first coupler and a first filter. The first coupler comprises a first terminal for inputting a high-frequency signal, a second terminal coupled to the first terminal, and third and fourth terminals for distributing thereto the signal inputted from the first terminal. The first filter is coupled to the second terminal.

In this electronic device, a high-frequency signal inputted from the first terminal of the first coupler is distributed to the third and fourth terminals. At this time, the first filter coupled to the second terminal of the first coupler sets a stopband and a passband for the electronic device. As a consequence, the electronic device selectively passes therethrough only high-frequency signals having frequencies in the passband. Here, each of the first coupler and first filter is constituted by a line, resistance element, capacitor, or the like having a small size and requires less precision in conductor patterns. Therefore, this electronic device can reduce its size and lower the requirement for precision in conductor patterns.

In the electronic device, the first coupler may be a 90-degree hybrid coupler. In this case, respective signals outputted from the third and fourth terminals are in antiphase with each other in the stopband. Therefore, combining the signals outputted from the third and fourth terminals together can more securely attenuate signals in the stopband.

The first filter may have a capacitor connected between the second terminal and a reference potential and a first line having one end connected to the second terminal and the other end left open. In this case, at such a frequency that the length of the first line corresponds to a quarter wavelength, the capacitor and the first line can be considered to be equivalently in a short-circuit state. Therefore, signals in antiphase with each other are outputted to the third and fourth terminals. As a consequence, the output obtained by combining the signals from the third and fourth terminals is blocked. At such a frequency that the length of the line of a divider corresponds to a quarter wavelength, on the other hand, the capacitor and the first line can be considered to be equivalently in an open state. Therefore, signals in phase with each other are outputted to the third and fourth terminals. As a consequence, the output obtained by combining the signals from the third and fourth terminals is enhanced. The electronic device thus functions as a high-pass filter.

The first filter may have a first line having one end connected to the second terminal and the other end left open and a second line having one end connected to the second terminal and the other end short-circuited to a reference potential. In this case, at such a frequency that the length of the first line corresponds to a quarter wavelength, the first and second lines can be considered to be equivalently in a short-circuit state. Therefore, signals in antiphase with each other are outputted to the third and fourth terminals. As a consequence, the output obtained by combining the signals from the third and fourth terminals is blocked. At such a frequency that the length of the line of a divider corresponds to a quarter wavelength, on the other hand, the first and second lines can be considered to be equivalently in an open state. Therefore, signals in phase with each other are outputted to the third and fourth terminals. As a consequence, the output obtained by combining the signals from the third and fourth terminals is enhanced. The electronic device thus functions as a low-pass filter. In this case, the second line functions as an inductance.

The first filter may have an FET (Field Effect Transistor) and a first line having one end connected to the second terminal and the other end left open, the FET having a drain terminal connected to the second terminal and a source terminal connected to a reference potential. In this case, changing a voltage applied to the gate terminal of the FET can make the amount of attenuation variable in the electronic device. This can also switch between whether to pass or block the output of a signal having a specific frequency, i.e., enable the electronic device to function as a switch.

The electronic device may further comprise a third line having one end connected to the third terminal and the other end connected to the fourth terminal. In this case, in a frequency band where the third and fourth terminals are excited in antiphase with each other, a midpoint of the third line is virtually grounded. That is, it is equivalent to a state where a stub having a short-circuited leading end is connected to the third and fourth terminals. This enables the electronic device to have a wider band.

The electronic device may further comprise a third line having one end connected to the third terminal and the other end connected to the fourth terminal, the third line having a line length twice that of the first line. In this case, when the length of the third line is twice a quarter wavelength, and both ends of the third line are excited in antiphase with each other, the potential at the midpoint of the third line becomes zero, whereby the midpoint of the third line is virtually grounded. That is, a quarter-wavelength stub having a short-circuited leading end is connected to the third and fourth terminals. The quarter-wavelength stub exhibits inductivity and capacitivity at frequencies lower and higher than a center frequency, respectively. This enables the electronic device to have a wider band.

The electronic device may further comprise a second filter, connected to the first terminal, for setting a stopband and a passband, the first and second filters having the same circuit structure. In this case, the fact that the second filter having the same circuit structure as that of the first filter is connected to the first terminal can further improve the signal transmission characteristic of the electronic device in the passband.

The electronic device may further comprise a second coupler having a first node connected to the third and fourth terminals through a line. In this case, respective signals outputted to the third and fourth terminals can be combined together at the first node, so as to be outputted to the outside of the electronic device.

The second coupler may have a resistance element connected between the third and fourth terminals. In the stopband in this case, a signal transmitted from the third terminal to the fourth terminal through the resistance element and a signal transmitted from the third terminal to the fourth terminal through the first node are in antiphase with each other and are combined together at the fourth terminal. Similarly, a signal transmitted from the fourth terminal to the third terminal through the resistance element and a signal transmitted from the fourth terminal to the third terminal through the first node are in antiphase with each other and are combined together at the third terminal. This attenuates signals in the stopband more securely.

An output signal of the third terminal may be in phase or antiphase with an output signal of the fourth terminal. When the output signal of the third terminal is in phase with the output signal of the fourth terminal in this case, the respective output signals of the third and fourth terminals are combined so as to enhance each other and outputted from the first node. When the output signal of the third terminal is in antiphase with the output signal of the fourth terminal, the respective output signals of the third and fourth terminals are combined so as to cancel each other out.

Details of Embodiments of the Invention

In the following, embodiments of the present invention will be explained in detail with reference to the accompanying drawings. In the explanation of the drawings, the same constituents will be referred to with the same signs while omitting their overlapping descriptions. The present invention is not limited to these illustrations, but is indicated by the claims and intends to include all the modifications within the spirit and scope equivalent to the claims.

FIG. 1 is a diagram illustrating a schematic structure of an electronic device. The electronic device 1 comprises a divider 10 (first coupler), a combiner 20 (second coupler), and a first filter 30. In electric signals inputted to an input terminal RFin, the electronic device 1 blocks signals in a low frequency band, but passes therethrough signals in a high frequency band and outputs them to an output terminal RFout. In one of examples of uses, the electronic device 1 passes therethrough signals in only one of two frequency bands adjacent to each other and blocks signals in the other frequency band. Examples of signals in the two frequency bands adjacent to each other include local and image signals.

In the following explanation, a wavelength corresponding to a frequency of a signal inputted to the electronic device 1 may be expressed as $\lambda$. A length sufficiently shorter than $\lambda$ may be expressed as $\alpha$. The lengths $\lambda$ and $\alpha$ will be used for indicating lengths of lines employed in the electronic device 1.

The divider 10 has input and output terminals. The input terminals include first and second terminals P1, P2. The output terminals include third and fourth terminals P3, P4. An example of the divider 10 is a 90-degree hybrid coupler. The divider 10 distributes high-frequency signals inputted from the first terminal P1 to the third and fourth terminals P3, P4.

Figure 2:
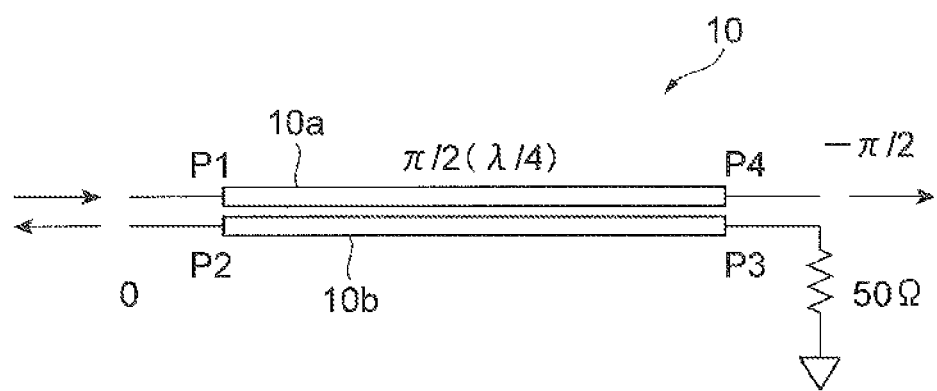
FIG. 2 is a diagram illustrating a schematic structure of a 90-degree hybrid coupler.

FIG. 2 illustrates an exemplary structure of the divider 10. The divider 10 has two lines 10a, 10b arranged parallel to each other, for example. One end of the line 10a is connected to the first terminal P1. The other end of the line 10a is connected to the fourth terminal P4. One end of the line 10b is connected to the second terminal P2. The other end of the line 10b is connected to the third terminal P3. Each of the lines 10a, 10b has a length $\lambda/4$ which corresponds to a quarter wavelength of an electric signal inputted to the electronic device 1. In other words, the phase of the electric signal differs by $\pi/2$ between one end side and the other end side of each of the lines 10a, 10b.

When an electric signal is inputted to the first terminal P1 with a terminator having a resistance value of 50Ω connected to the third terminal P3 as illustrated in FIG. 2, a signal having no phase difference with respect to the signal inputted to the first terminal P1 is outputted to the second terminal P2. A signal having a phase difference of $\pi/2$ with respect to the signal inputted to the first terminal P1 is outputted to the fourth terminal P4.

Returning to FIG. 1, the explanation will continue. The combiner 20 has a first node 21. The first node 21 is connected to the third terminal P3 through a quarter-wavelength line 22 and to the fourth terminal P4 through a quarter-wavelength line 23. One end of the quarter-wavelength line 22 is connected to the third terminal P3. The other end of the quarter-wavelength line 22 is connected to the first node 21. One end of the quarter-wavelength line 23 is connected to the fourth terminal P4. The other end of the quarter-wavelength line 23 is connected to the first node 21. An example of the combiner 20 is a Wilkinson divider.

The combiner 20 also has a resistance element 24. The resistance element 24 is connected between the third and fourth terminals P3, P4.

The first filter 30 is connected to the second terminal P2. The first filter 30 sets a frequency band in which the first filter 30 is short-circuited as a stopband of the electronic device 1 and a frequency band in which the first filter 30 is open as a passband of the electronic device 1.

Specifically, the first filter 30 has a capacitor 31 and a first line 32. One end of the capacitor 31 is connected to a reference potential GND. The other end of the capacitor 31 is connected to one end of the first line 32. The other end of the first line 32 is open. The length of the first line 32 is set slightly longer than a quarter wavelength of the subject electric signal. The length of the first line 32 is expressed as $\lambda/4+\alpha$.

The electronic device 1 further comprises a third line 41 and capacitors 42, 43. The third line 41 is set slightly longer than a half wavelength of the subject electric signal. Specifically, the line length of the third line 41 is twice that of the first line 32. That is, the length of the third line 41 is expressed as $2\times(\lambda/4+\alpha)$.

Figure 3A:
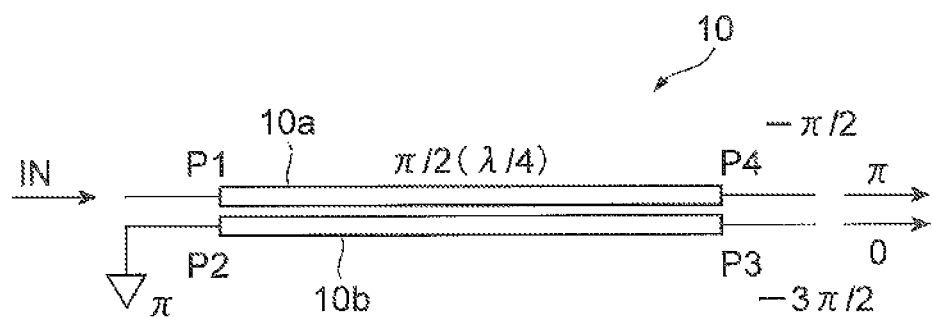
FIGS. 3A and 3B are diagrams illustrating phases of input/output signals of a divider.

As a basis for explaining operations of the electronic device 1, operations of its constituents will now be explained. FIG. 3 is a diagram illustrating phases of input/output signals of the divider 10. FIG. 3A is a diagram illustrating phases of the input/output signals in the case where the second terminal P2 is short-circuited to the reference potential GND. In this case, the signal outputted to the third terminal P3 has a phase difference of $3\pi/2$ with respect to the signal inputted to the first terminal P1, while the signal outputted to the fourth terminal P4 has a phase difference of $\pi/2$ with respect to the signal inputted to the first terminal P1. That is, the phase difference between the signal outputted to the third terminal P3 and the signal outputted to the fourth terminal P4 is $\pi$. In other words, the signal outputted to the third terminal P3 and the signal outputted to the fourth terminal P4 are in antiphase with each other.

Figure 3B:
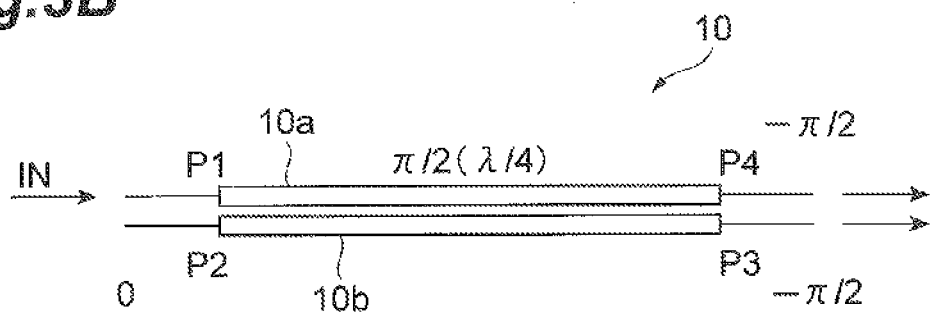

FIG. 3B is a diagram illustrating phases of the input/output signals in the case where the second terminal P2 is open. In this case, each of the respective signals outputted to the third and fourth terminals P3, P4 has a phase difference of $\pi/2$ with respect to the signal inputted to the first terminal P1. That is, the phase difference between the signal outputted to the third terminal P3 and the signal outputted to the fourth terminal P4 is 0. In other words, the signal outputted to the third terminal P3 and the signal outputted to the fourth terminal P4 are in phase with each other.

Figure 4:
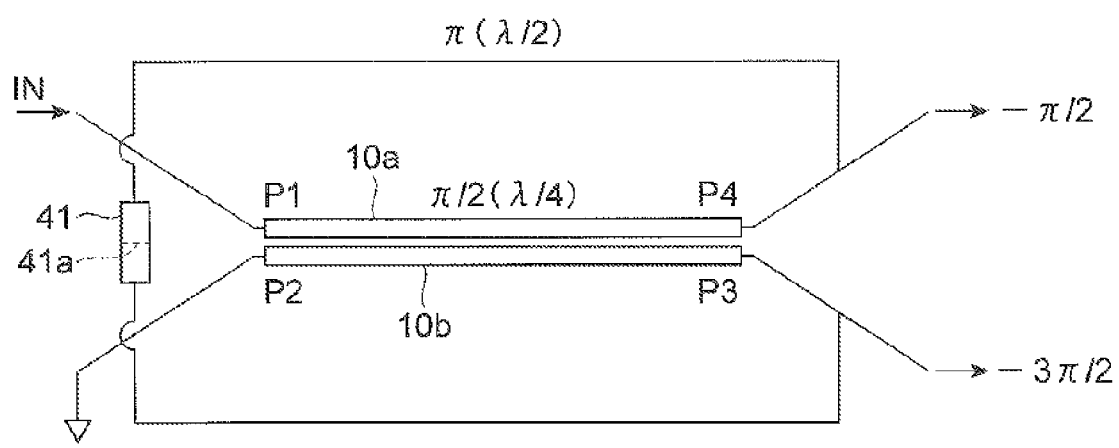
FIG. 4 is a diagram for explaining functions of a third line.

Functions of the third line 41 will now be explained with reference to FIG. 4. When the second terminal P2 is short-circuited to the reference potential GND, the signals outputted to the third and fourth terminals P3, P4 have phase differences of $3\pi/2$ and $\pi/2$, respectively, with respect to the signal inputted from the first terminal P1 as illustrated in FIG. 3A. That is, the signal outputted to the third terminal P3 and the signal outputted to the third terminal P4 are in antiphase with each other. As a consequence, the respective signals from the third and fourth terminals P3, P4 cancel each other out at a midpoint 41a of the third line 41 connected between the third and fourth terminals P3, P4. Therefore, the midpoint 41a is virtually grounded.

Figure 5:
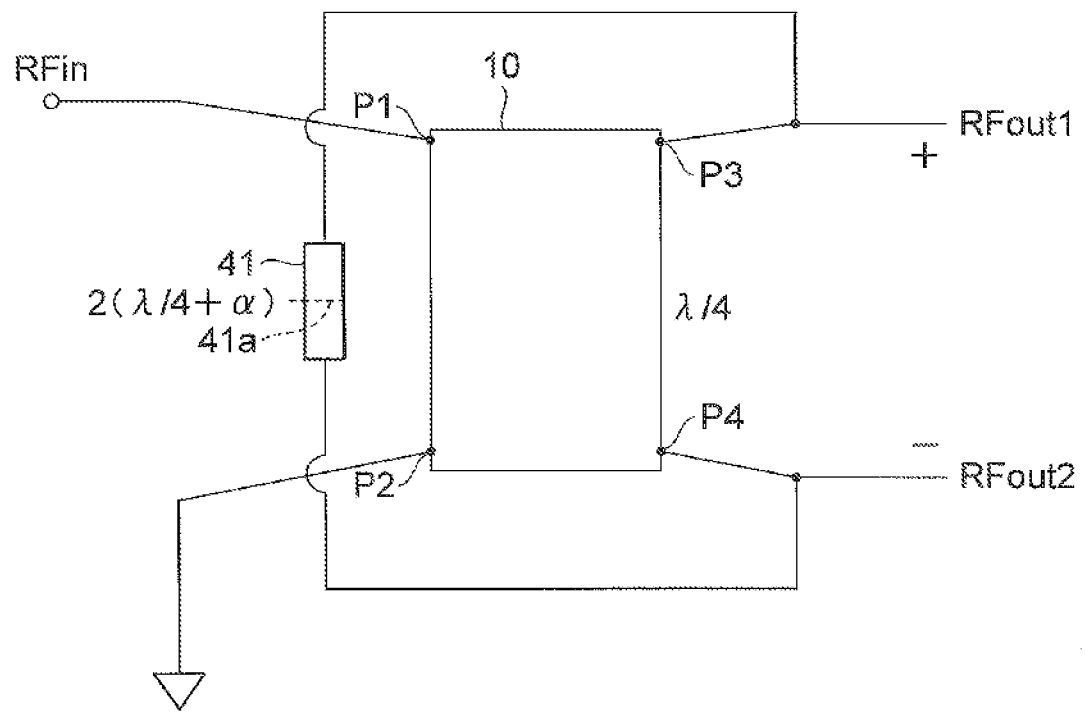
FIG. 5 is a diagram for explaining an anti-phase divider circuit.

Operations of the divider 10 will now be explained with reference to FIGS. 5 to 8. In the case where the second terminal P2 is short-circuited to the reference potential GND, the signal outputted to the third terminal P3 and the signal outputted to the fourth terminal P4 are in antiphase with each other as illustrated in FIG. 5. That is, the divider 11 operates as an anti-phase divider circuit.

Figure 6:
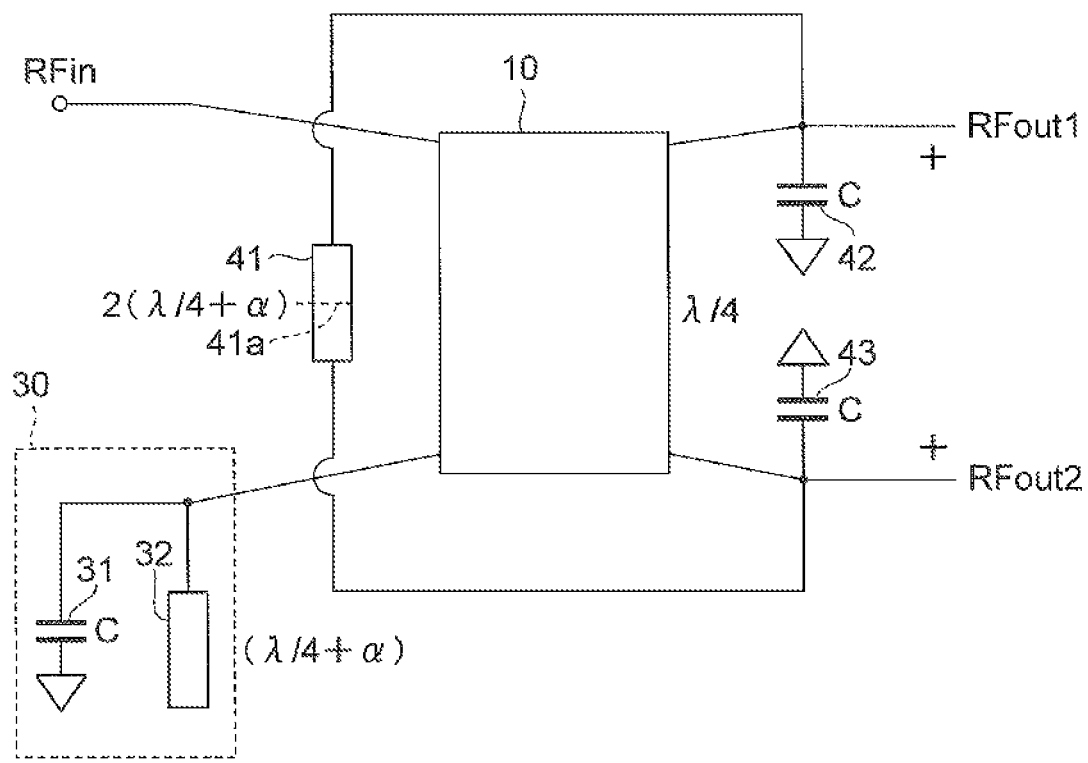
FIG. 6 is a diagram for explaining an in-phase divider circuit.

At such a frequency that the first filter 30 can be considered to be open, the signal outputted to the third terminal P3 and the signal outputted to the fourth terminal P4 are in phase with each other as illustrated in FIG. 6. That is, the divider 10 operates as an in-phase divider circuit. Here, such a frequency that the first filter 30 can be considered to be open is a resonance frequency of an LC resonant circuit constituted by the capacitor 31 and first line 32. At this resonance frequency, the line length of the first line 32 is $\lambda/4+\alpha$. The first line 32 equivalently functions as a short stub having a length $\alpha$. Therefore, the first line 32 functions as an inductor.

Making the capacitors 42, 43 each have a capacitance C equal to that of the capacitor 31 maximizes the output level of the signals outputted to the third and fourth terminals P3, P4.

Figure 7A:
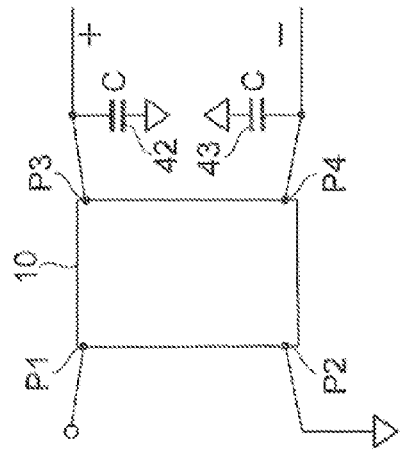
FIGS. 7A, 7B and 7C are diagrams for explaining a combining operation of the anti-phase and in-phase divider circuits.
Figure 7B:
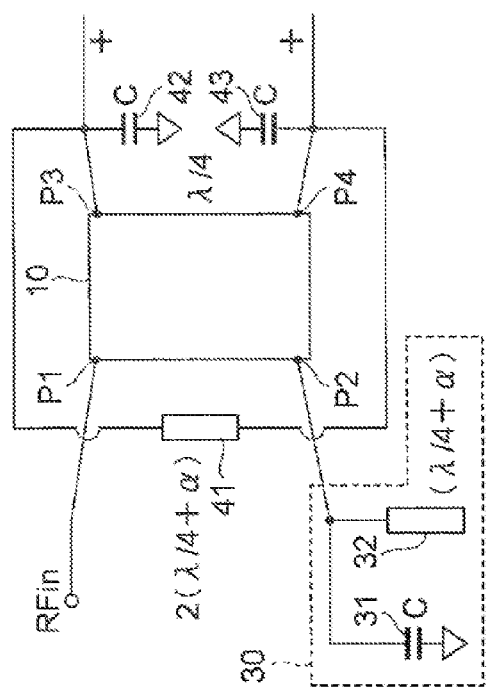

Changes in operations of the divider 10 depending on frequencies of input signals will now be explained with reference to FIG. 7. When a signal having a wavelength of $\lambda'=\lambda+4\alpha$ is inputted to the divider 10 and first filter 30 illustrated in FIG. 7A, $\lambda'/4=\lambda/4+\alpha$, whereby the first line 32 becomes a quarter-wavelength line. In this case, the second terminal P2 operates as if short-circuited as illustrated in FIG. 7B. Therefore, as explained with reference to FIG. 5, the signal outputted to the third terminal P3 and the signal outputted to the fourth terminal P4 are in antiphase with each other.

Figure 7C:
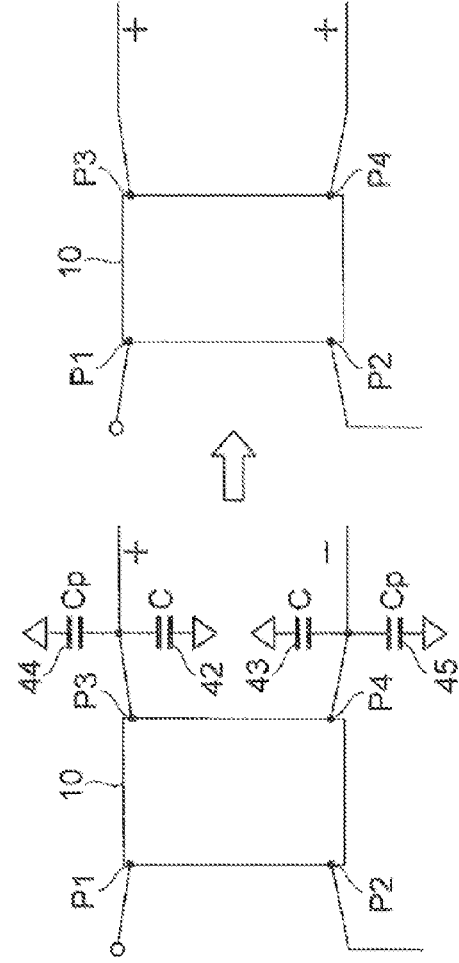

When a signal having a wavelength of $\lambda$ is inputted, the first line 32 functions as an inductor as explained with reference to FIG. 6. When this inductor is expressed as virtual capacitors 44, 45 each having a capacitance Cp=−C, the capacitances of the capacitors 42, 44 cancel each out, and so do the capacitances of the capacitors 43, 45, as illustrated in FIG. 7C, thereby inhibiting filter characteristics from being deteriorated by capacitive components.

Figure 8A:
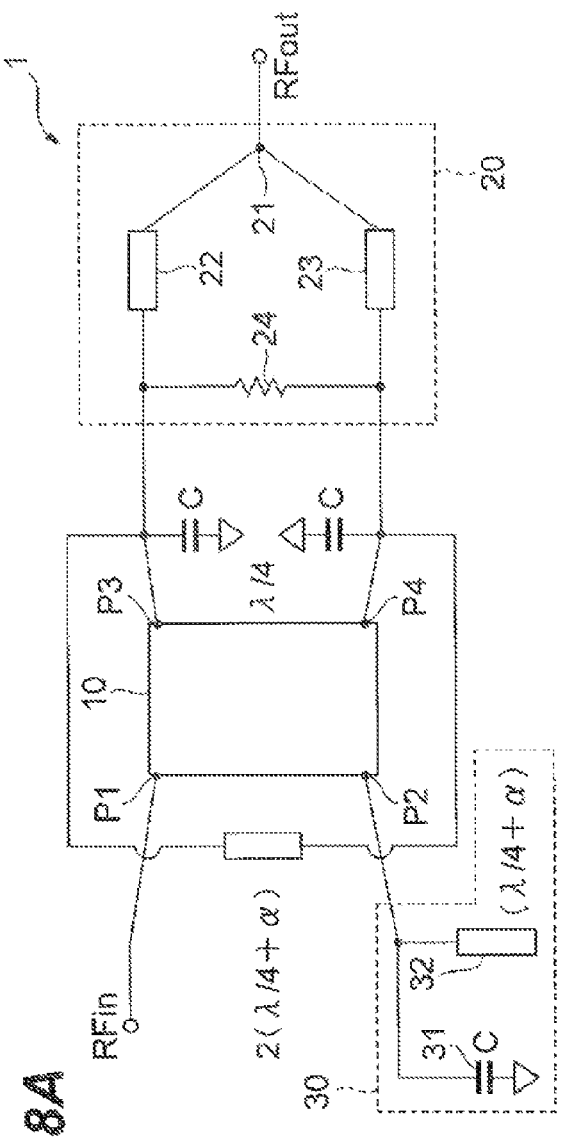
FIGS. 8A, 8B and 8C are diagrams for explaining an operation for absorbing an antiphase output.
Figure 8C:
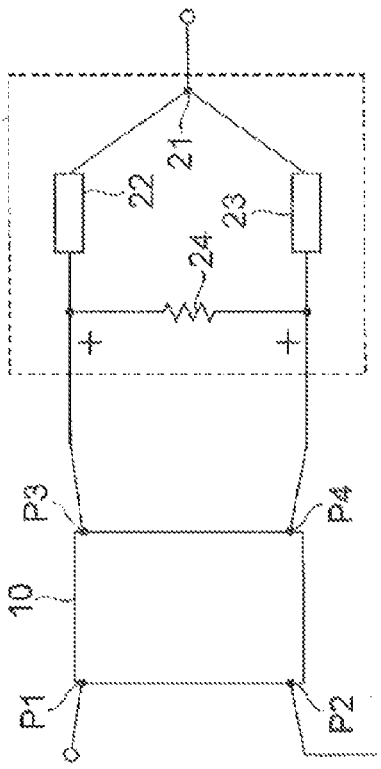
Figure 8B:
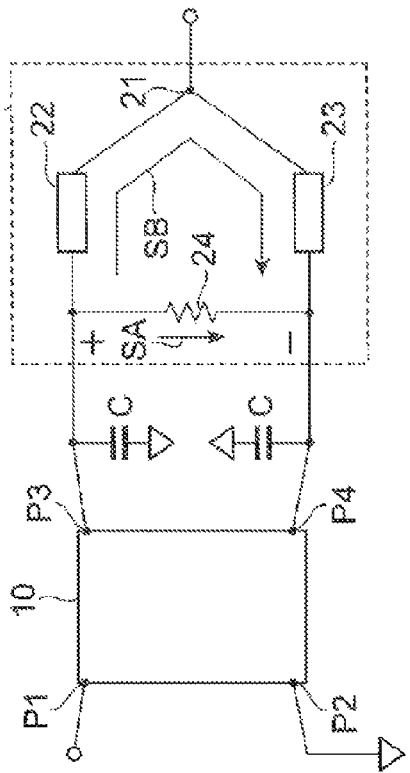

Operations of the combiner 20 will now be explained with reference to FIG. 8. FIG. 8A illustrates the circuit structure of the electronic device 1 including the combiner 20. FIG. 8B illustrates a flow of signals when a signal having a wavelength of $\lambda'=\lambda+4\alpha$ is inputted. At the wavelength of the inputted signal, as explained with reference to FIG. 7B, the signal outputted to the third terminal P3 and the signal outputted to the fourth terminal P4 are in antiphase with each other. Therefore, the signal transmitted from the third terminal P3 through the quarter-wavelength line 22 and the signal transmitted from the fourth terminal P4 through the quarter-wavelength line 23 cancel each other out at the first node 21. As a consequence, the electronic device 1 blocks the signal having the wavelength of $\lambda'=\lambda+4\alpha$.

When the signal having the wavelength of $\lambda'=\lambda+4\alpha$ is inputted, the resistance element 24 causes impedances to match in the third terminal P3, fourth terminal P4, and first node 21. The resistance element 24 functions to cancel signals out as follows. Phases of a signal SA transmitted from the third terminal P3 to the fourth terminal P4 through the resistance element 24 and a signal SB transmitted from the third terminal P3 to the resistance element 24 through the quarter-wavelength line 22, first node 21, and quarter-wavelength line 23 will now be considered. Since the signal SB travels through the two quarter-wavelength lines 22, 23, a phase difference occurs by a half wavelength between the signals SA and SB at the fourth terminal P4. That is, at the fourth terminal P4, the signals SA and SB are in antiphase with each other and cancel each other out.

When a signal having a wavelength of $\lambda$ is inputted, on the other hand, the signal outputted to the third terminal P3 and the signal outputted to the fourth terminal P4 are in phase with each other as explained with reference to FIG. 6. Therefore, at the first node 21, the signal transmitted from the third terminal P3 through the quarter-wavelength line 22 and the signal transmitted from the fourth terminal P4 through the quarter-wavelength line 23 enhance each other. As a consequence, the electronic device 1 passes therethrough the signal having the wavelength of $\lambda$ (FIG. 8C).

FIG. 9 illustrates results of simulation of S-parameters in a high-pass filter made by using such an operation principle. The simulation was performed in a state including the implementation loss assuming that a chip equipped with the electronic device 1 was mounted on a substrate. For example, the simulation was performed assuming that line loss per wavelength was about 1 dB.

Figure 9B:
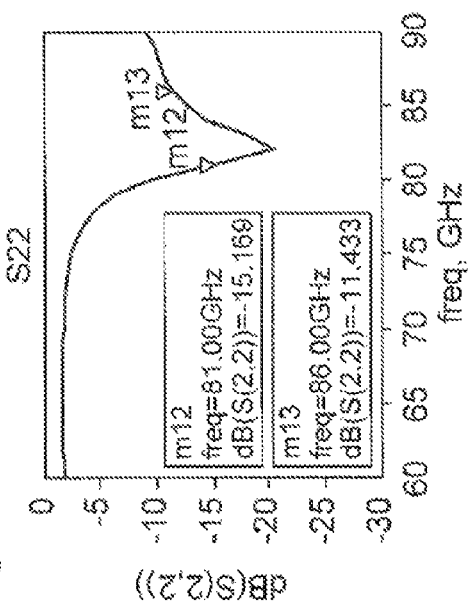
FIGS. 9A, 9B and 9C are graphs illustrating a high-pass filter characteristic caused by absorption of the antiphase output.
Figure 9A:
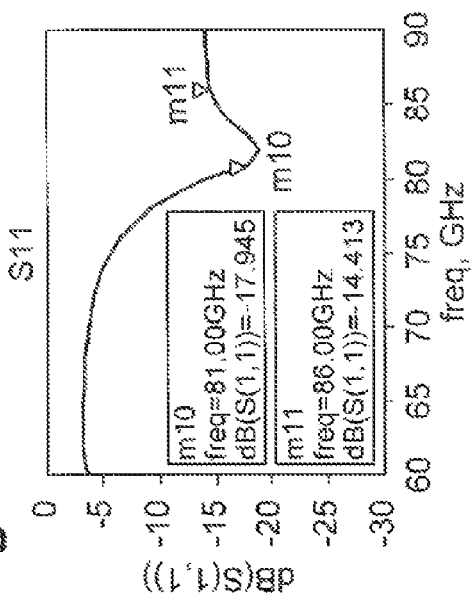
Figure 9C:
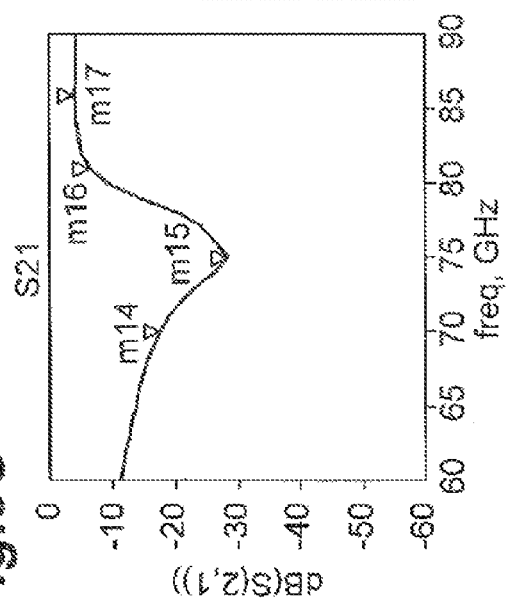

FIG. 9A indicates S11. S11 represents a reflection coefficient on the input terminal side of the electronic device 1. FIG. 9B indicates S22. S22 represents a reflection coefficient on the output terminal side of the electronic device 1. FIG. 9C indicates S21. S21 represents a transmission from the input terminal to the output terminal of the electronic device 1. This high-pass filter is designed such as to have a passband of 81 to 86 GHz and a stopband of 70 to 75 GHz. As illustrated in FIG. 9C, the passage loss is 4.0 to 6.5 dB, while the amount of suppression is 11 to 24 dBc.

Figure 10:
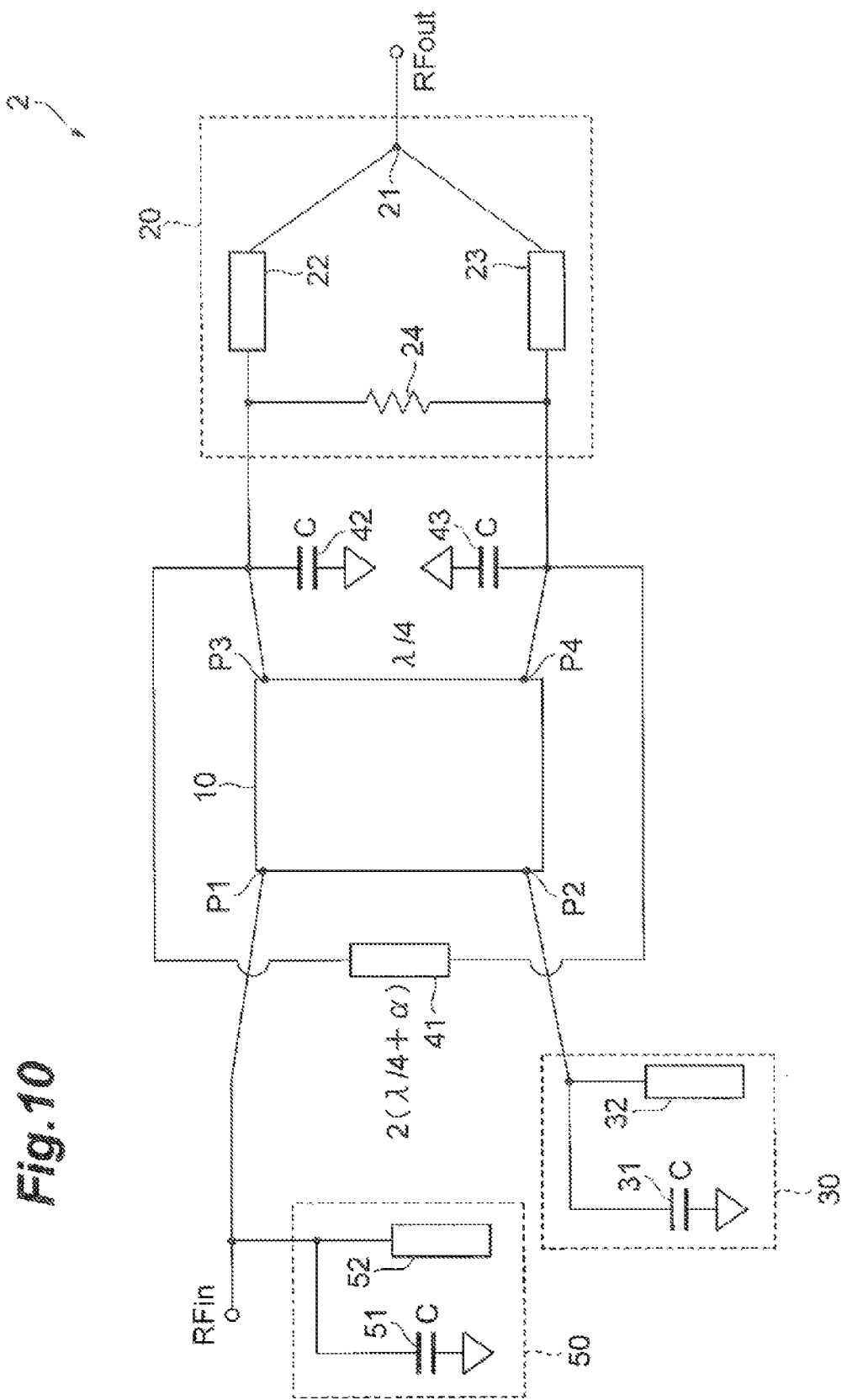
FIG. 10 is a diagram illustrating a circuit structure for enlarging a stopband.

FIG. 10 illustrates a modified example of the electronic device. This electronic device 2 differs from the electronic device 1 illustrated in FIG. 1 in that it further comprises a second filter 50. The second filter 50 is connected to the first terminal P1 and sets a stopband and a passband. The second filter 50 has the same circuit structure as that of the first filter 30. That is, the second filter 50 comprises a capacitor 51 and a first line 52. The capacitance of the capacitor 51 may be equal to or different from that of the capacitor 31. The length of the first line 52 may be equal to or different from that of the first line 32.

Figure 11:
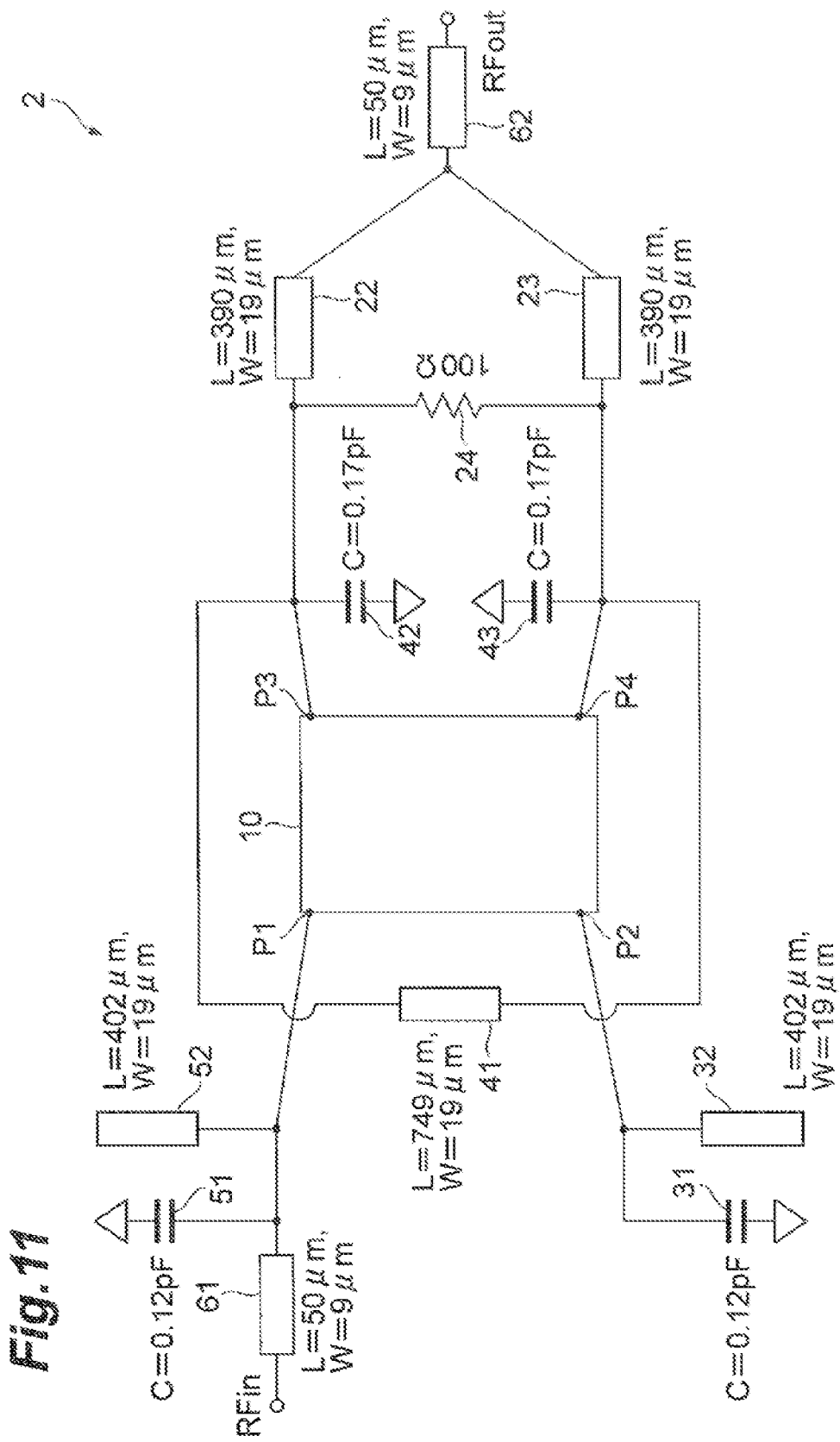
FIG. 11 is a diagram illustrating an example of a high-pass filter circuit.

FIG. 11 illustrates an example of specific element values of elements in the electronic device 2. Each of the capacitors 31, 51 has a capacitance of 0.12 pF. Each of the capacitors 42, 43 has a capacitance of 0.17 pF. Each of the quarter-wavelength lines 22, 23 has a length of 390 μm and a width of 19 μm. The third line 41 has a length of 749 μm and a width of 19 μm. Each of the first lines 32, 52 has a length of 402 μm and a width of 19 μm. The resistance element 24 has a resistance value of 100Ω.

In the electronic device 2 illustrated in FIG. 11, a line 61 having a length of 50 μm and a width of 9 μm is inserted in series with the input terminal RFin. A line 62 having a length of 50 μm and a width of 9 μm is inserted in series with the output terminal RFout.

Figure 12B:
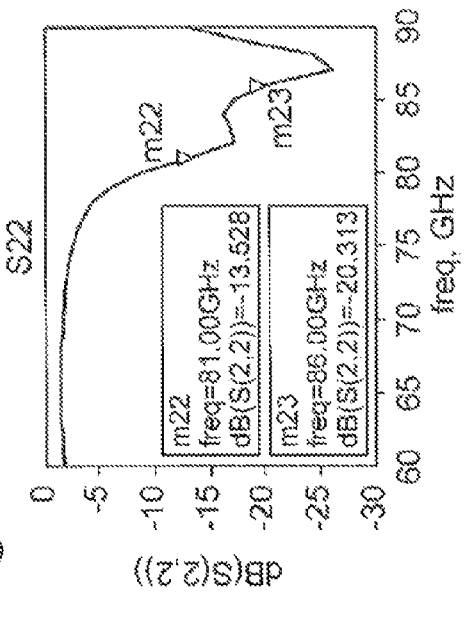
FIGS. 12A, 12B and 12C are graphs illustrating results of simulation of characteristics in the high-pass filter circuit.
Figure 12A:
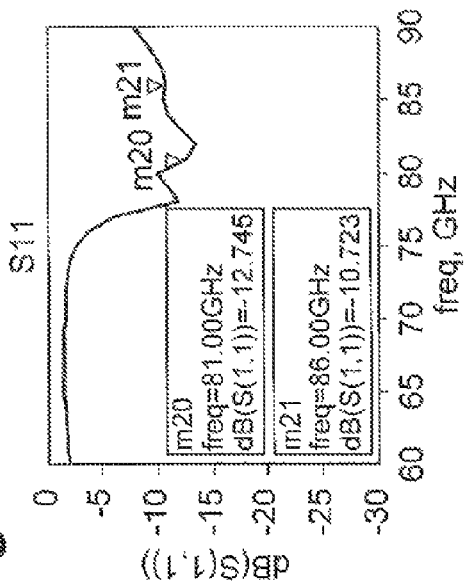
Figure 12C:
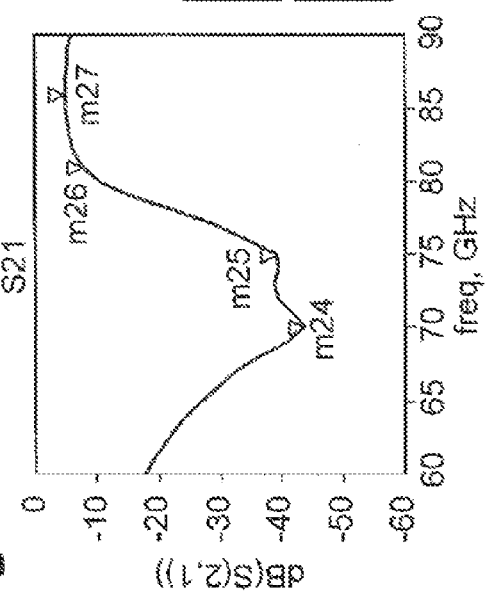

FIG. 12 illustrates results of simulation of S-parameters in the electronic device 2 represented in FIG. 11. FIG. 12A indicates S11. FIG. 12B indicates S22. FIG. 12C indicates S21. As illustrated in FIG. 12C, the passband is 81 to 86 GHz, while the stopband is 70 to 75 GHz. The passage loss is 4.9 to 7.7 dB, while the amount of suppression is 34 to 44 dBc.

A low-pass filters can be obtained by replacing capacitors with inductors in a high-pass filter such as the electronic devices 1, 2 illustrated in FIGS. 1 and 10. FIG. 13 illustrates the circuit structure of an electronic device 3 as an example of low-pass filters. The electronic device 3 comprises first and second filters 33, 53 in place of the first and second filters 30, 50, respectively. The first filter 33 has an inductor 34 as a second line and a first line 35. The second filter 53 has an inductor 54 and a first line 55. The electronic device 3 also comprises inductors 46, 47 in place of the capacitors 42, 43. The inductor 34 has one end connected to the second terminal P2 and the other end short-circuited to a reference potential.

FIG. 13 also illustrates an example of element values of the elements. Each of the inductors 34, 54 has an inductance of 0.030 nH. Each of the quarter-wavelength lines 22, 23 and first line 35 has a length of 325 μm and a width of 19 μm. The first line 55 has a length of 318 μm and a width of 19 μm. Each of the lines 61, 62 has a length of 50 μm and a width of 9 μm. The resistance element 24 has a resistance value of 100Ω.

In the electronic device 3 illustrated in FIG. 13, the line lengths of the first lines 35, 55 are set to values slightly different from each other. This minutely adjusts the bandwidth of the stopband of the electronic device 3.

Figure 14B:
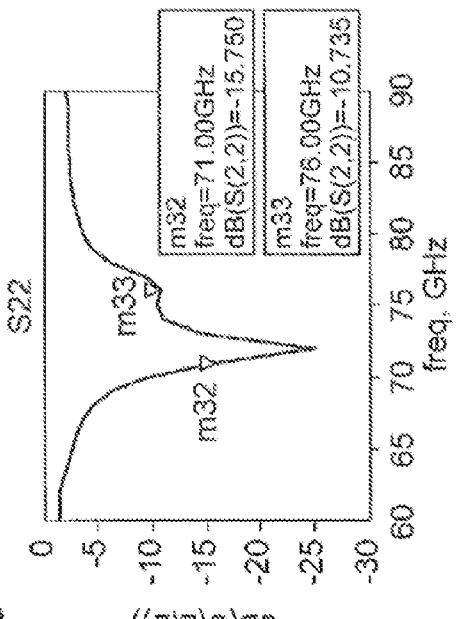
FIGS. 14A, 14B and 14C are graphs illustrating results of simulation of the low-pass filter circuit.
Figure 14A:
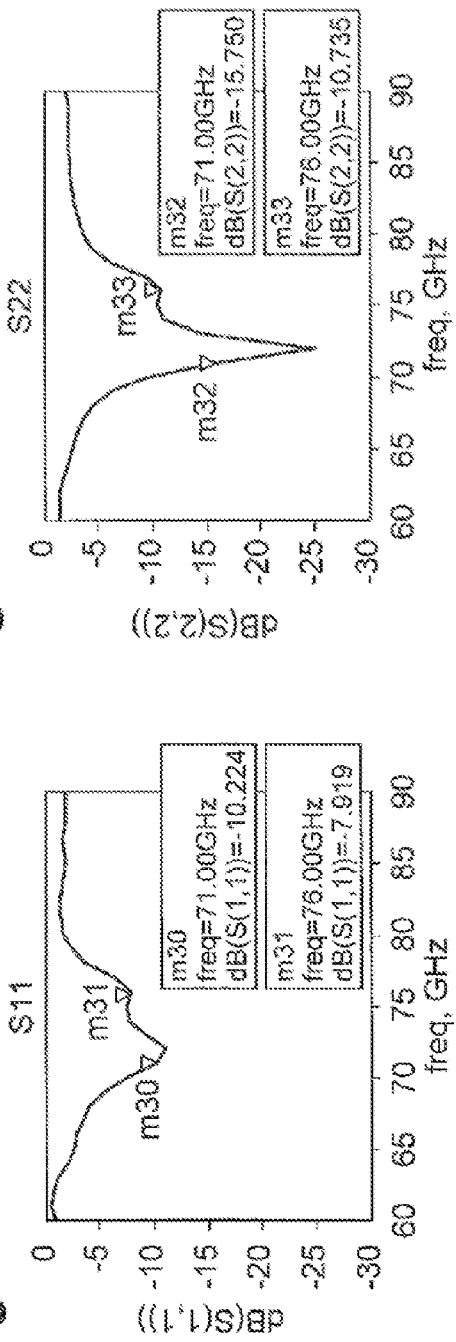
Figure 14C:
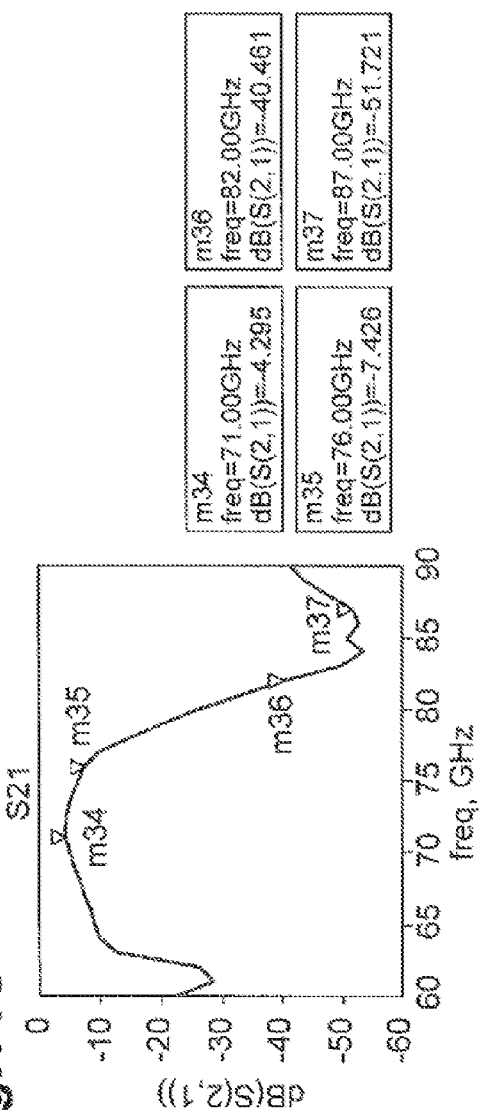

FIG. 14 illustrates results of simulation of S-parameters in the electronic device 3 represented in FIG. 13. FIG. 14A indicates S11. FIG. 14B indicates S22. FIG. 14C indicates S21. As illustrated in FIG. 14C, the passband is 71 to 76 GHz, while the stopband is 82 to 87 GHz. The passage loss is 4.3 to 7.5 dB, while the amount of suppression is 36 to 44 dBc.

Figure 15:
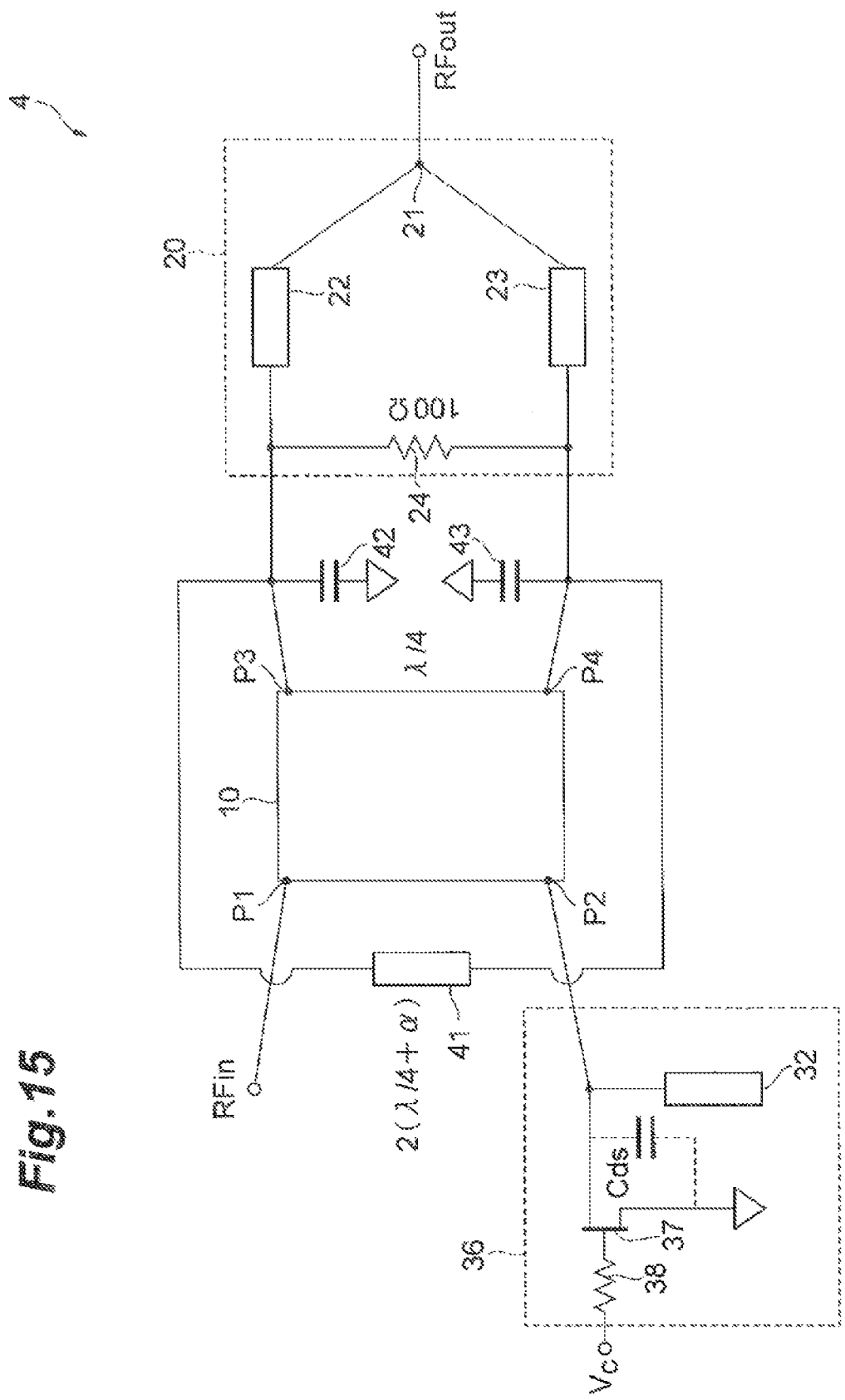
FIG. 15 is a diagram illustrating an application example of a variable attenuator.

FIG. 15 illustrates the circuit structure of an electronic device 4 in accordance with another modified example. The electronic device 4 differs from the electronic device 1 illustrated in FIG. 1 in that it comprises a first filter 36 in place of the first filter 30. The first filter 36 comprises an FET 37 and a resistance element 38 in place of the capacitor 31 in the first filter 30. The FET 37 has a drain terminal connected to the third terminal P2. The FET 37 has a gate terminal connected to one end of the resistance element 38. A control terminal Vc is connected to the other end of the resistance element 38. A control voltage signal for regulating a drain-source admittance Yds, that is a combination of a drain-source resistance Rds and a drain-source capacitance Cds of the FET 37 is inputted to the control terminal Vc.

The FET 37 operates in a state where no bias voltage is applied. An example of the control voltage signal is a digital voltage signal taking one of values at two levels. In this case, the control voltage signal turns the FET 37 on/off, so as to switch the drain-source admittance Yds of the FET 37 between two different values. Frequency coefficients of the bandwidth of the passband and the like in the electronic device 4 vary according to the drain-source admittance Yds of the FET 37. Therefore, the electronic device 4 can change its frequency coefficients by switching the control voltage signal.

Figure 16:
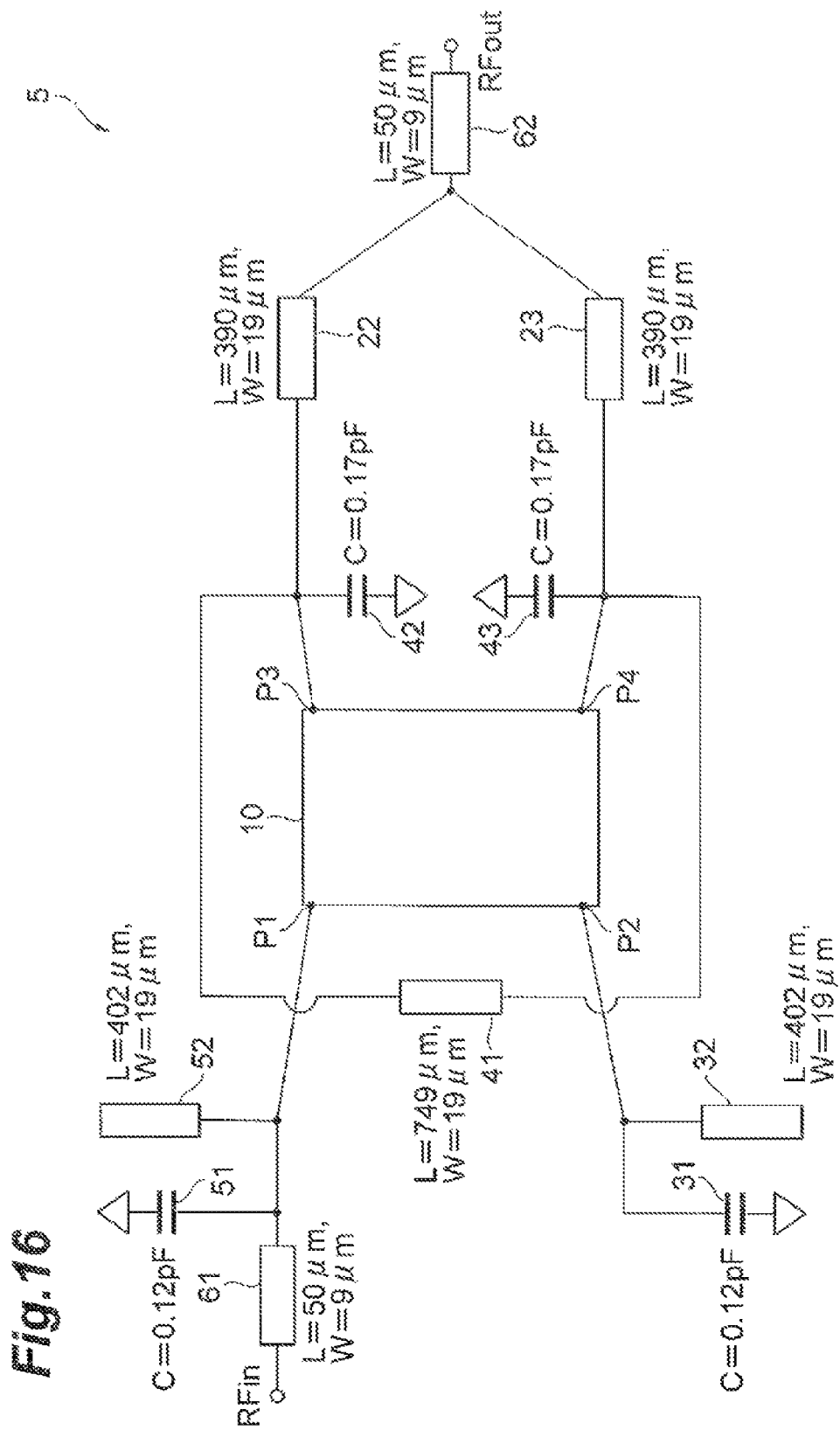
FIG. 16 is a diagram illustrating another example of the high-pass filter circuit.

FIG. 16 illustrates the circuit structure of an electronic device 5 in accordance with still another modified example. The electronic device 5 differs from the electronic device 2 illustrated in FIG. 11 in that it is devoid of the resistance element 24.

Figure 17B:
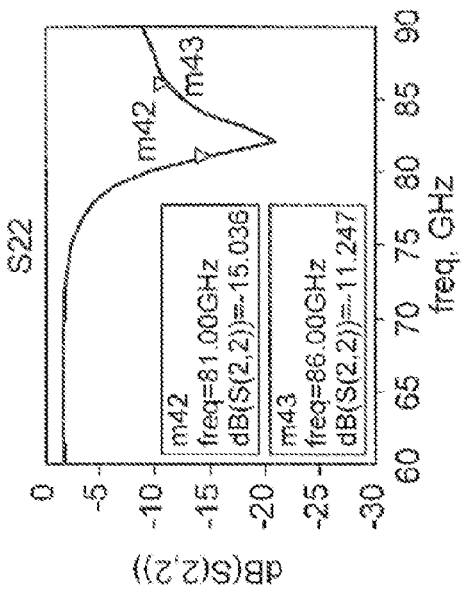
FIGS. 17A, 17B and 17C are graphs illustrating results of simulation of characteristics in the above example of the high-pass filter circuit.
Figure 17A:
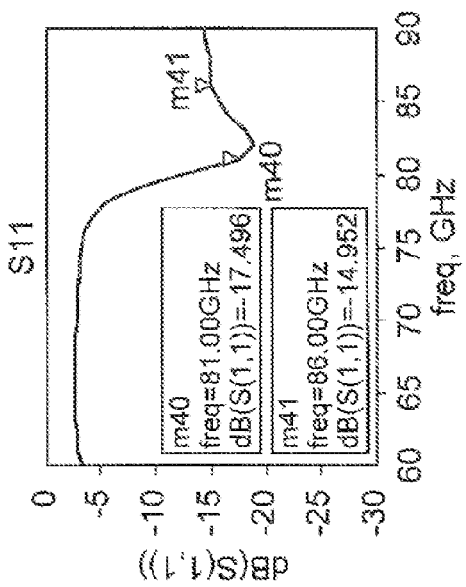
Figure 17C:
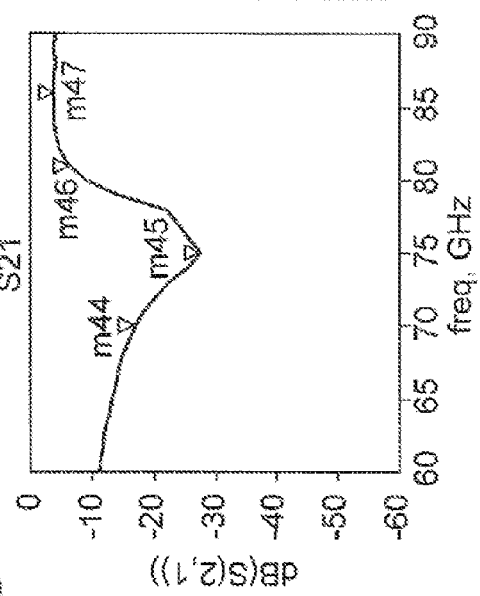

FIG. 17 illustrates results of simulation of S-parameters in the electronic device 5 represented in FIG. 16. FIG. 17A indicates S11. FIG. 17B indicates S22. FIG. 17C indicates S21. As illustrated in FIG. 17C, the passband is 81 to 86 GHz, while the stopband is 70 to 75 GHz. The passage loss is 3.9 to 6.3 dB, while the amount of suppression is 10.9 to 23.8 dBc.

The control voltage signal may be an analog voltage signal. This enables frequency coefficients of the electronic device 4 to change continuously according to the control voltage signal.

Figure 18:
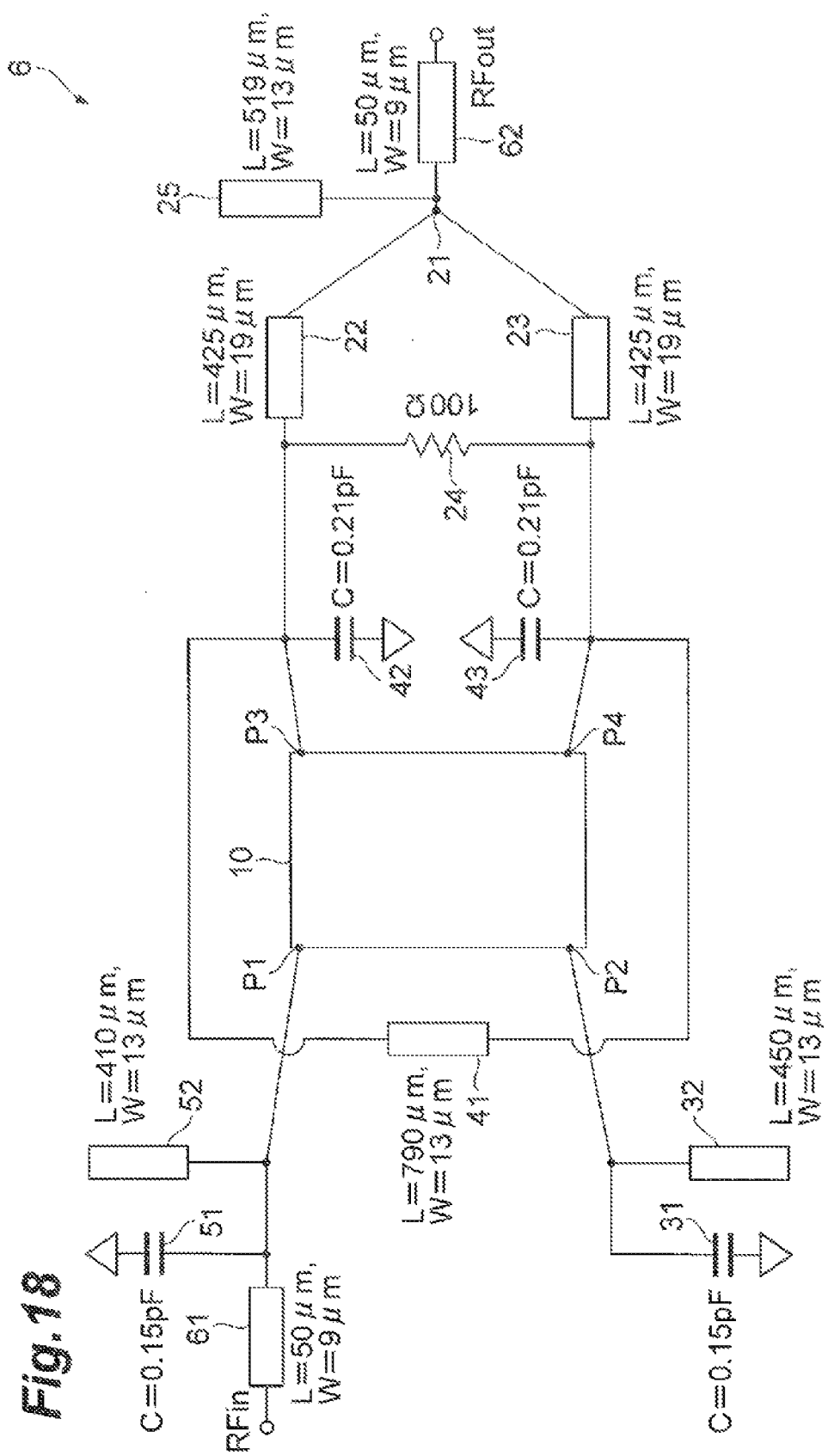
FIG. 18 is a diagram illustrating still another example of the high-pass filter circuit.

FIG. 18 illustrates the circuit structure of an electronic device 6 in accordance with yet another modified example. The electronic device 6 differs from the electronic device 2 illustrated in FIG. 11 in that it further comprises a line 25. One end of the line 25 is connected to the first node 21. The first node 21 is as explained previously with reference to FIG. 1. The other end of the line 25 is open. The length of the line 25 is set longer than a quarter wavelength of the subject electric signal. The length of the line 25 may be set longer than the length ($\lambda/4+\alpha$) of the first line 32, for example.

The line 25 is set longer than a quarter wavelength of the subject electric signal and thus equivalently functions as a short stub (i.e., inductance). Connecting the line 25 functioning as a short stub to the first node 21 can regulate the magnitude of signals outputted to the output terminal RF through the first node 21 and line 62. For example, signals having a relatively low frequency are more susceptible to the short stub and thus are easier to attenuate, whereas signals having a relatively high frequency are less susceptible to the short stub and thus are harder to attenuate. Thus making the short stub regulate the magnitude of signals outputted to the output terminal RF enables the electronic device 6 to have a steeper characteristic as a filter.

For example, the electronic device 6 can serve as a high-pass filter for passing therethrough signals near 76 GHz and blocking signals lower by about 2 GHz than the former signals. FIG. 18 illustrates an example of element values of elements in the electronic device 6 for attaining such a high-pass filter. In the example illustrated in FIG. 18, each of the capacitors 31, 51 has a capacitance of 0.15 pF. Each of the capacitors 42, 43 has a capacitance of 0.21 pF. Each of the quarter-wavelength lines 22, 23 has a length of 425 µm and a width of 19 µm. In the first lines 32, 52, the first line 32 has a length of 450 µm and a width of 13 µm, while the first line 52 has a length of 410 µm and a width of 13 µm. In the lines 25, 61, 62, the line 25 has a length of 519 µm and a width of 13 µm, while each of the lines 61, 62 has a length of 50 µm and a width of 9 µm. The third line 41 has a length of 790 µm and a width of 13 µm. The resistance element 24 has a resistance value of 100Ω.

Figure 19A:
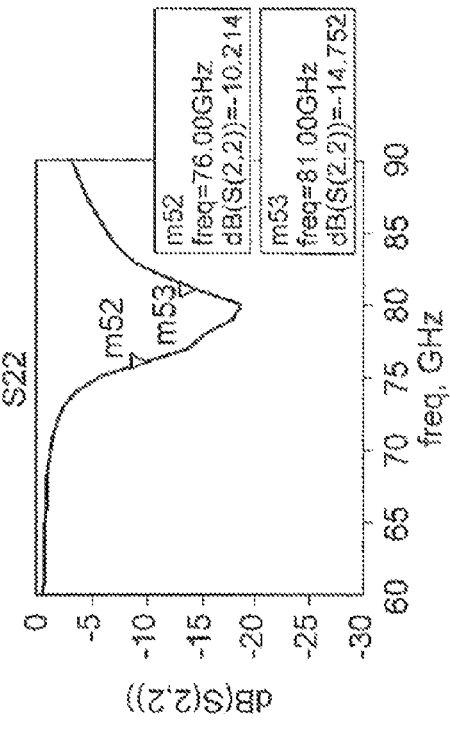
FIGS. 19A, 19B and 19C are graphs illustrating results of simulation of characteristics in the above example of the high-pass filter circuit.
Figure 19B:
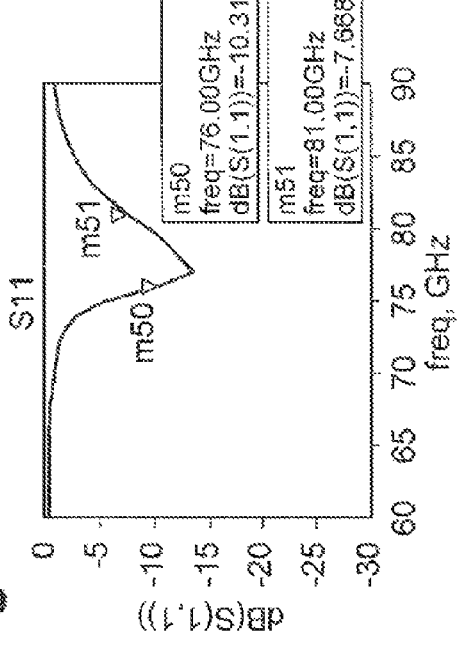
Figure 19C:
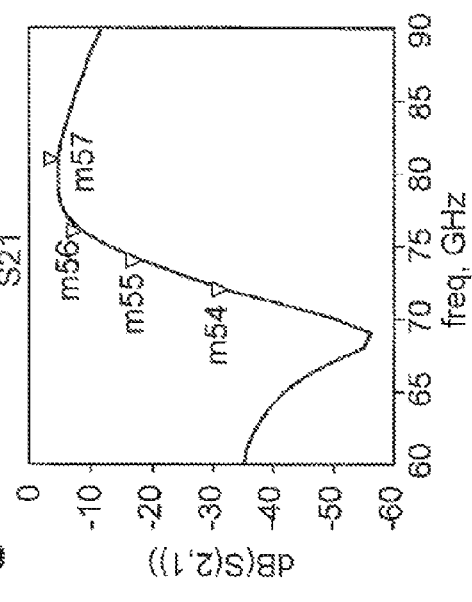

FIG. 19 illustrates results of simulation of S-parameters in the electronic device 6 represented in FIG. 18. FIG. 19A indicates S11. FIG. 19B indicates S22. FIG. 19C indicates S21. As illustrated in FIG. 19C, the passband is 76 to 81 GHz, while the stopband includes 74 GHz and 72 GHz. The passage loss is 5.0 to 8.6 dB, while the amount of suppression is 10 dBc at 74 GHz and 24 dBc at 72 GHz.

In the electronic devices 1 to 6 in accordance with the above-mentioned embodiments, as explained in the foregoing, high-frequency signals inputted from the first terminal P1 of the divider 10 are distributed to the third and fourth terminals P3, P4 and then are combined by the combiner 20, so as to be outputted from the first node 21. At this time, the first filters 30, 33, 36 connected to the second terminal P2 of the divider 10 set the stopbands and passbands of the electronic devices 1 to 5. This enables the electronic devices 1 to 5 to selectively pass therethrough only high frequency signals having frequencies in their passbands. Here, each of the divider 10, combiner 20, and first filters 30, 33, 36 is constituted by lines, resistance elements, capacitors, and the like each having a small size and requires less precision in conductor patterns. Therefore, these electronic devices can reduce their sizes and lower the requirement for precision in conductor patterns.

In the electronic devices 1 to 4, 6, the combiner 20 has the resistance element 24 connected between the third and fourth terminals P3, P4. In the stopband in this case, the signal transmitted from the third terminal P3 to the fourth terminal P4 through the resistance element 24 and the signal transmitted from the third terminal P3 to the fourth terminal P4 through the first node 21 are in antiphase with each other and combined together at the fourth terminal P4. Similarly, the signal transmitted from the fourth terminal P4 to the third terminal P3 through the resistance element 24 and the signal transmitted from the fourth terminal P4 to the third terminal P3 through the first node 21 are in antiphase with each other and combined together at the third terminal P3. Therefore, signals in the stopband attenuate more securely.

In the electronic devices 1, 2, 5, 6, the first filter 30 has the capacitor 31 connected between the second terminal P2 and the reference potential and the first line 32 having one end connected to the second terminal P2 and the other end left open. In this case, at such a frequency that the length of the first line 32 corresponds to a quarter wavelength, the capacitor 31 and the first line 32 are considered to be equivalently in a short-circuit state. Therefore, signals in antiphase with each other are outputted to the third and fourth terminals P3, P4, whereby the output from the first node 21 is blocked. At such a frequency that the length of the line of the divider 10 corresponds to a quarter wavelength, on the other hand, the capacitor 31 and the first line 32 can be considered to be equivalently in an open state. Therefore, signals are outputted in phase with each other to the third and fourth terminals P3, P4, whereby the output from the first node 21 is enhanced. The electronic devices 1, 2, 5 thus function as high-pass filters.

In the electronic device 3, the first filter 33 has the first line 35 having one end connected to the second terminal P2 and the other end left open and the second line 34 having one end connected to the second terminal P2 and the other end short-circuited to the reference potential. In this case, at such a frequency that the length of the first line 35 corresponds to a quarter wavelength, the first and second lines 35, 34 can be considered to be equivalently in a short-circuit state. Therefore, signals are outputted in antiphase with each other to the third and fourth terminals P3, P4, whereby the output from the first node 21 is blocked. At such a frequency that the length of each of the lines 10a, 10b of the divider 10 corresponds to a quarter wavelength, on the other hand, the first filter 33 can be considered to be equivalently in an open state. Therefore, signals in phase with each other are outputted to the third and fourth terminals P3, P4, whereby the output from the first node 21 is enhanced. The electronic device 3 thus functions as a low-pass filter. In this case, the second line 34 functions as an inductance.

In the electronic device 4, the first filter 36 has the FET 37 and the first line 32 having one end connected to the second terminal P2 and the other end left open, while the FET 37 has the drain terminal connected to the second terminal P2 and the source terminal connected to the reference potential. In this case, changing a voltage applied to the gate terminal of the FET 37 can make the amount of attenuation variable in the electronic device 4. This can also switch between whether to pass or block the output of a signal having a specific frequency, i.e., enable the electronic device 4 to function as a switch.

The electronic devices 1 to 6 further comprise the third line 41 having one end connected to the third terminal P3 and the other end connected to the fourth terminal P4. In this case, in a frequency band where the third and fourth terminals P3, P4 are excited in antiphase with each other, the midpoint 41a of the third line 41 is virtually grounded. That is, it is equivalent to a state where a stub having a short-circuited leading end is connected to the third and fourth terminals P3, P4. This enables the electronic devices 1 to 6 to have a wider band.

In the electronic devices 1 to 6, the third line 41 may have a line length twice that of each of the first lines 32, 35. In this case, when the length of the third line 41 is twice a quarter wavelength, and both ends of the third line 41 are excited in antiphase with each other, the potential at the midpoint 41a of the third line 41 becomes zero, whereby the midpoint 41a of the third line 41 is virtually grounded. That is, a quarter-wavelength stub having a short-circuited leading end is connected to the third and fourth terminals P3, P4. The quarter-wavelength stub exhibits inductivity and capacitivity at frequencies lower and higher than a center frequency, respectively. This enables the electronic devices 1 to 6 to have a wider band.

The electronic devices 2, 3, 5, 6 further comprise the second filters 50, 53, connected to the first terminal P1, for setting the stopbands and passbands, while the second filters 50, 53 have the same circuit structures as those of the first filters 30, 33. In this case, the fact that the second filters 50, 53 having the same circuit structures as those of the first filters 30, 33 are connected to the first terminal can further improve signal transmission characteristics of the electronic devices 2, 3, 5, 6 in their passbands.

The electronic device 6 further comprises the line 25 having one end connected to the first node and the other end left open. In this case, the function of the line 25 as a short stub enables the electronic device 6 to have a steeper characteristic as a filter.

The present invention is not limited to the above-mentioned embodiments. For example, the electronic devices 1 to 6 may be devoid of the third line 41.

What is claimed is:
1. An electronic device comprising:
a first coupler having a first terminal for inputting a high-frequency signal, a second terminal coupled to the first terminal, and third and fourth terminals for distributing thereto the signal inputted from the first terminal;
a first filter coupled to the second terminal; and
a first line having one end connected to the third terminal and the other end connected to the fourth terminal;
wherein the first filter has a capacitor connected between the second terminal and a reference potential and a second line having one end connected to the second terminal and the other end left open, the first line having a line length twice that of the second line.

2. An electronic device according to claim 1, wherein the first coupler is a 90-degree hybrid coupler.

3. An electronic device comprising:
a first coupler having a first terminal for inputting a high-frequency signal, a second terminal coupled to the first terminal, and third and fourth terminals for distributing thereto the signal inputted from the first terminal;
a first filter coupled to the second terminal; and
a first line having one end connected to the third terminal and the other end connected to the fourth terminal;
wherein the first filter has a second line having one end connected to the second terminal and the other end left open and a third line having one end connected to the second terminal and the other end short-circuited to a reference potential, the first line having a line length twice that of the second line.

4. An electronic device comprising:
a first coupler having a first terminal for inputting a high-frequency signal, a second terminal coupled to the first terminal, and third and fourth terminals for distributing thereto the signal inputted from the first terminal;
a first filter coupled to the second terminal; and
a first line having one end connected to the third terminal and the other end connected to the fourth terminal;
wherein the first filter has an FET (Field Effect Transistor) including a control terminal, a drain terminal, and a source terminal and a second line having one end connected to the second terminal and the other end left open, the first line having a line length twice that of the second line; and
wherein the drain and source terminals of the FET are connected to the second terminal and a reference potential, respectively.

5. An electronic device according to claim 1, further comprising a second filter, connected to the first terminal, for setting a stopband and a passband;
wherein the first and second filters have the same circuit structure.

6. An electronic device according to claim 1, further comprising a second coupler having a first node connected to the third and fourth terminals.

7. An electronic device according to claim 6, wherein the second coupler has a second node between the third terminal and the first node, a third node between the fourth terminal and the first node, and a resistance element connected between the second and third nodes.

8. An electronic device according to claim 6, wherein an output signal of the third terminal is a signal in phase or antiphase with an output signal of the fourth terminal.

9. An electronic device according to claim 7, further comprising a third line connected between the first and second nodes.

10. An electronic device according to claim 7, further comprising a third line connected between the first and third nodes.

11. An electronic device according to claim 7, further comprising a fourth node connected between the first node of the second coupler and an output terminal; and
a third line having one end connected to the fourth node.

* * * * *